(12) United States Patent
Zhu et al.

(10) Patent No.: US 11,246,232 B2
(45) Date of Patent: Feb. 8, 2022

(54) DISPLAY DEVICE

(71) Applicant: WuHan TianMa Micro-electronics CO., LTD, Wuhan (CN)

(72) Inventors: Qifeng Zhu, Wuhan (CN); Fang Wan, Wuhan (CN); Jiang Chen, Wuhan (CN)

(73) Assignee: WuHan TianMa Micro-electronics CO., LTD, Wuhan (CN)

( * ) Notice: Subject to any disclaimer, the term of this patent is extended or adjusted under 35 U.S.C. 154(b) by 61 days.

(21) Appl. No.: 16/913,806

(22) Filed: Jun. 26, 2020

(65) Prior Publication Data
US 2021/0274665 A1  Sep. 2, 2021

(30) Foreign Application Priority Data
Feb. 28, 2020 (CN) .......................... 202010127149.1

(51) Int. Cl.
| | | |
|---|---|---|
| *H05K 7/02* | (2006.01) | |
| *H05K 7/04* | (2006.01) | |
| *H05K 5/02* | (2006.01) | |
| *H05K 5/00* | (2006.01) | |

(52) U.S. Cl.
CPC ......... *H05K 5/0217* (2013.01); *H05K 5/0017* (2013.01)

(58) Field of Classification Search
USPC ....................................................... 361/807
See application file for complete search history.

(56) References Cited

U.S. PATENT DOCUMENTS

| | | | | |
|---|---|---|---|---|
| 11,003,217 B2* | 5/2021 | Cha | ..................... | G06F 1/1652 |
| 2019/0243424 A1* | 8/2019 | Lee | ..................... | G06F 1/1679 |

FOREIGN PATENT DOCUMENTS

| | | |
|---|---|---|
| CN | 104299524 B | 2/2017 |
| CN | 108538207 A | 9/2018 |

* cited by examiner

*Primary Examiner* — Hung S. Bui
(74) *Attorney, Agent, or Firm* — Christensen O'Connor Johnson Kindness PLLC

(57) ABSTRACT

A display device, when fully unfolded, has a first display area, a first bendable area, and a second display area along a first direction, the first bendable area connecting the first display area with the second display area. The display device includes: a flexible display screen including a light exiting surface and an opposite light non-exiting surface; a support structure including an elastic support net including first and second ends along the first direction; and a support layer located on a light non-exiting surface side of the flexible display screen and including a first stop portion located in the second display area. The first end is fixed to the support layer in the first display area; and when the flexible display screen is fully unfolded, the elastic support net is loosened and the second end is in contact with the first stop portion to support the first bendable area.

19 Claims, 9 Drawing Sheets

DISPLAY DEVICE

CROSS-REFERENCE TO RELATED APPLICATIONS

The present application claims the benefit of priority to Chinese Patent Application No. 202010127149.1, filed on Feb. 28, 2020, the content of which is incorporated herein by reference in its entirety.

TECHNICAL FIELD

The present disclosure relates to the field of display technologies, for example, for a display device.

BACKGROUND

FIG. 1 is a schematic diagram of a display device in the related art. As shown in FIG. 1, the flexible display screen P in the related art includes a bendable area B. The flexible display screen P is fold or unfolded through the bendable area B. The flexible display screen P displays images when in an unfolded state. The flexible display screen P, when folded, is convenient to carry. However, when the flexible display screen P is unfolded, the bendable area B is uneven, which affects the display effect.

SUMMARY

The present disclosure provides a display device. The display device having a first display area, a first bendable area, and a second display area that are arranged sequentially along a first direction when the display device is fully unfolded, the first bendable area connecting the first display area with the second display area. The display device includes: a flexible display screen including a light exiting surface and a light non-exiting surface that are disposed oppositely to each other; a support structure including an elastic support net, and a support layer located on a side of the flexible display screen where the light non-exiting surface is located. The elastic support net includes a first end and a second end that are disposed oppositely to each other along the first direction. The support layer includes a first stop portion located in the second display area, the first end of the elastic support net is fixed to the support layer in the first display area, and when the display device is fully unfolded, the flexible display screen is fully unfolded, and the elastic support net is loosened and the second end of the elastic support net is in contact with the first stop portion to support the first bendable area.

BRIEF DESCRIPTION OF DRAWINGS

In order to more clearly illustrate technical solutions in embodiments of the present disclosure, the accompanying drawings used in the embodiments are briefly introduced as follows. The drawings described as follows are representative embodiments of the present disclosure.

DESCRIPTION OF EMBODIMENTS

In order to better understand technical solutions of the present disclosure, the embodiments of the present disclosure are described in detail with reference to the drawings.

It should be clear that the described embodiments are representative embodiments of the present disclosure rather than all of the embodiments.

The terms used in the embodiments of the present disclosure are for describing embodiments but not intended to limit the present disclosure. Unless otherwise noted in the context, the expressions "a", "an", "the" and "said" in a singular form used in the embodiments and appended claims of the present disclosure are also intended to represent plural form expressions thereof.

It should be understood that the term "and/or" used herein is an association relationship describing associated objects, indicating that there may be three relationships, for example, A and/or B may indicate three cases, i.e., A alone, A and B, or B alone. In addition, the character "/" herein generally indicates that the related objects before and after the character form an "or" relationship.

It should be understood that the devices can be described using the terms "first", "second", etc., in the embodiments of the present disclosure, but these devices will not be limited by these terms. These terms are used to distinguish devices from one another. For example, without departing from the scope of the embodiments of the present disclosure, a first device can also be referred to as a second device, and similarly, a second device can also be referred to as a first device.

Figure 1:
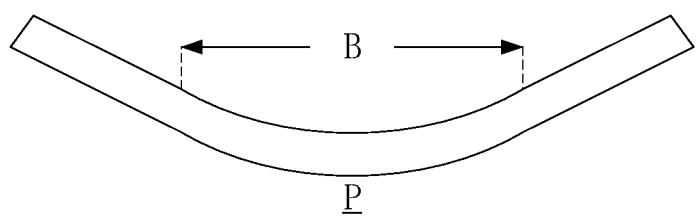
FIG. 1 is a schematic diagram of a display device in the related art.
Figure 2:
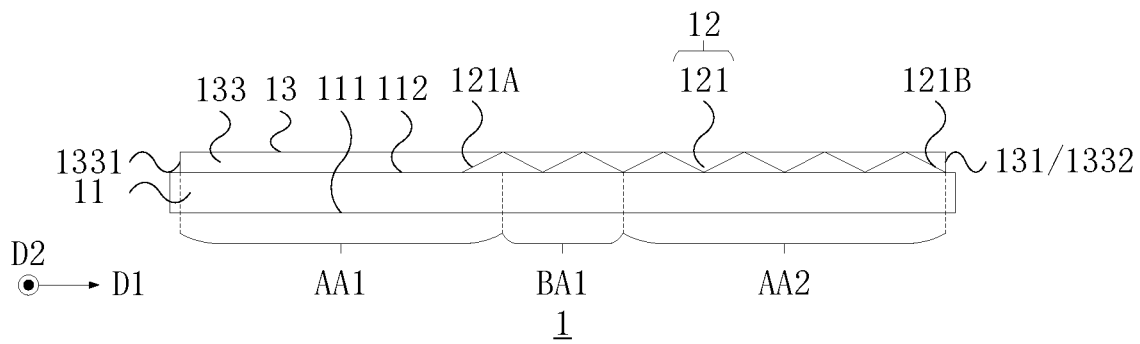
FIG. 2 is a top view of a display device in an unfolded state according to a representative embodiment of the present disclosure.
Figure 3:
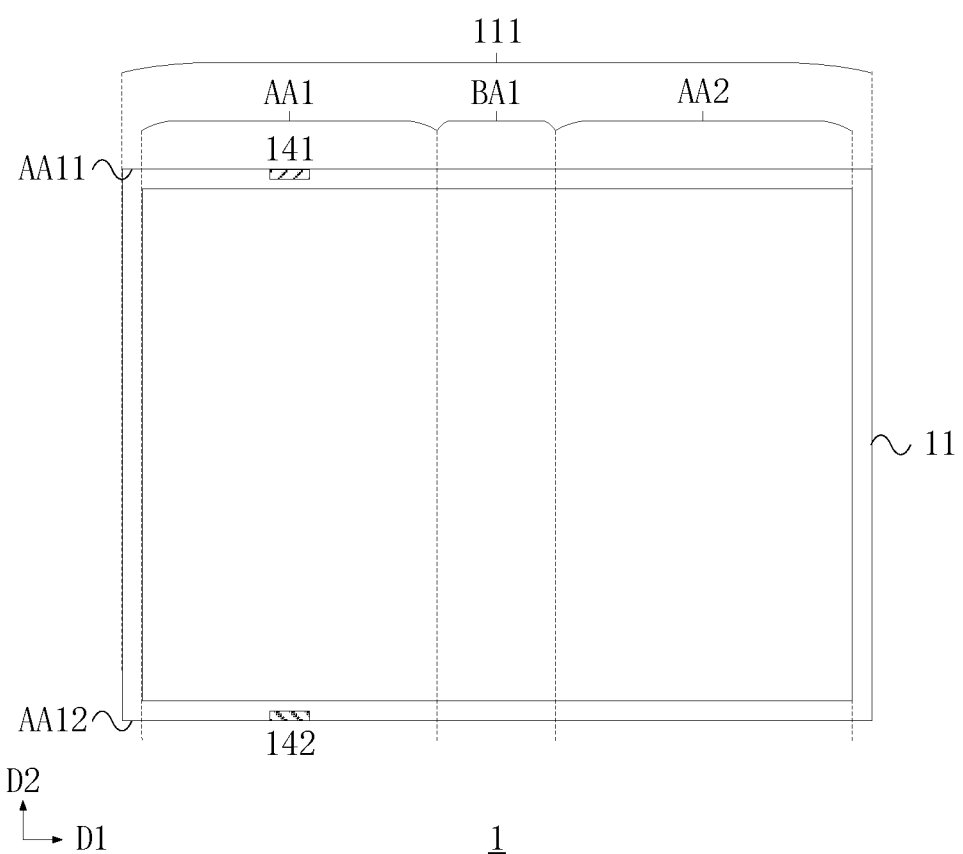
FIG. 3 is a front view of a display device in an unfolded state according to a representative embodiment of the present disclosure.
Figure 4:
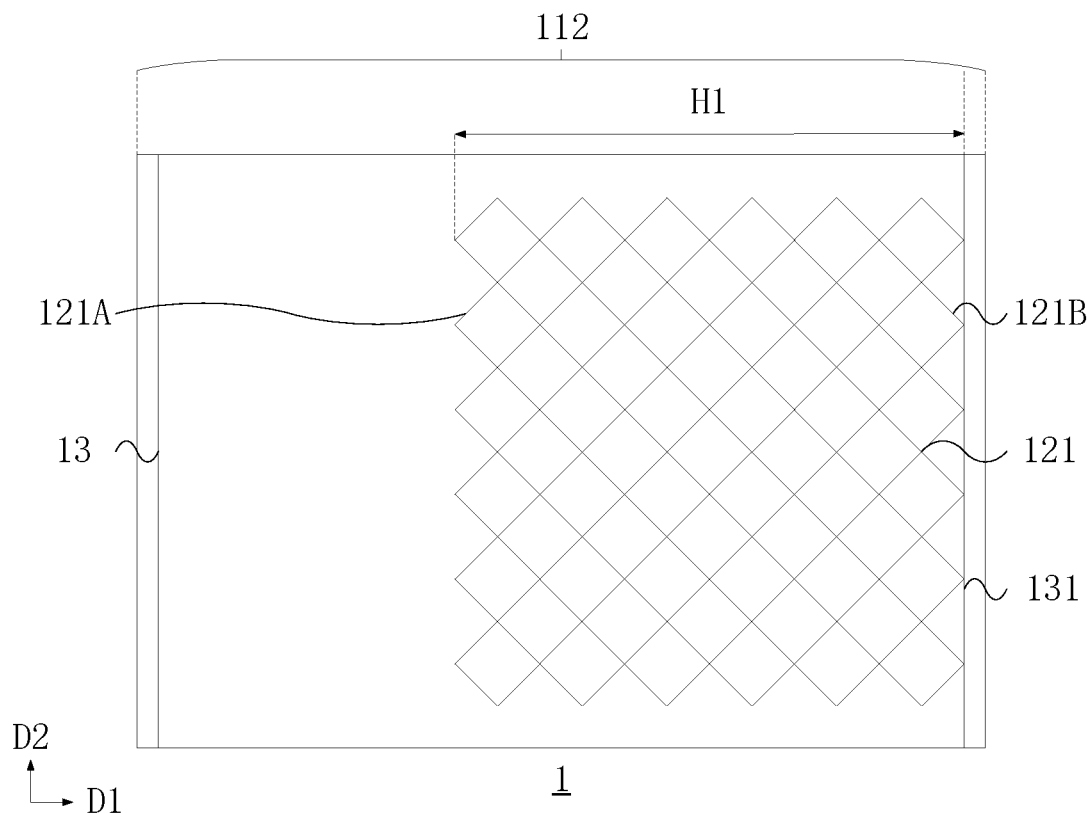
FIG. 4 is a rear view of a display device in an unfolded state according to a representative embodiment of the present disclosure.

The present disclosure provides a display device. FIG. 2 is a top view of a display device in an unfolded state according to an embodiment of the present disclosure. FIG. 3 is a front view of a display device in an unfolded state according to an embodiment of the present disclosure. FIG. 4 is a rear view of a display device in an unfolded state according to an embodiment of the present disclosure.

As shown in FIG. 2 to FIG. 4, the display device 1 includes a flexible display screen 11 and a support structure 12, and the support structure 12 includes an elastic support net 121. When the display device 1 is in a fully unfolded state, the display device 1 has a first display area AA1, a first bendable area BA1, and a second display area AA2 that are arranged in sequence along a first direction D1. That is, when the display device 1 is fully unfolded, the display screen is fully unfolded, and the various areas of the display device 1, including the first display area AA1, the first bendable area BA1, and the second display area AA2 are substantially in the same plane. The first bendable area BA1 connects the first display area AA1 with the second display area AA2. The display device 1 further includes a support layer 13, and the support layer 13 includes a first stop portion 131 located in the display area AA2. The flexible display screen 11 includes a light exiting surface 111 and a light non-exiting surface 112 disposed oppositely to the light exiting surface 111, and the support layer 13 is located on a side of the flexible display screen 11 where the light non-exiting surface 112 is located. The elastic support net 121 includes a first end 121A and a second end 121B that are arranged oppositely to each other along the first direction D1. The first end 121A of the elastic support net 121 is fixed to the support layer 13 in the first display area AA1. When the flexible display screen 11 is in a fully unfolded state, the elastic support net 121 is in a loosened state, and the second end 121B of the elastic support net 121 is in contact with the first stop portion 131 to support the first bendable area BA1. It could be understood that the support layer 13 and the elastic support net 121 are located in the same layer, or in other words, the elastic support net 121 is located in the support layer 13. The first stop portion 131 is made of a hard material, such as PET, acrylic, or other materials that have a relatively large modulus of elasticity, in order to overcome the force applied by the elastic support net 121 in a loosened state and plays a role in stopping the elastic support net 121.

The display device 1 can be unfolded or folded. The display device 1 can be used as a tablet to display images when it is in an unfolded state. In this case, the flexible display screen 11 is in an unfolded state and emits light through the light exiting surface 111; and the first bendable area BA1 is in an unfolded state and is located between the first display area AA1 and the second display area AA2. The first display area AA1, the first bendable area BA1 and the second display area AA2 corporately display an image. And in this case, the support structure 12 is unfolded through the elasticity of the elastic support net 121 to support the flexible display screen 11, the first end 121A of the elastic support net 121 is located in the first display area AA1, the second end 121B of the elastic support net 121 is located in the second display area AA2, the elastic support net 121 supports the first display area AA1 and the second display area AA2, and the elastic support net 121 supports the first bendable area BA1. In addition, the support layer 13 is located on a side of the flexible display screen 11 where the light non-exiting surface 112 is located, the first end 121A of the elastic support net 121 is fixed to the support layer 13, and the elastic support net 121 is in contact with the support layer 13 at the second end 121B. The support layer 13 includes the first stop portion 131 configured to block and stop the second end 121B of the loosened elastic support net 121 after the flexible display screen 11 is unfolded. The support structure 12 supports the flexible display screen 11 through the support layer 13 to maintain the flexible display screen 11 straight and fully flat, thereby improving the display effect and improving user experience.

Figure 5:
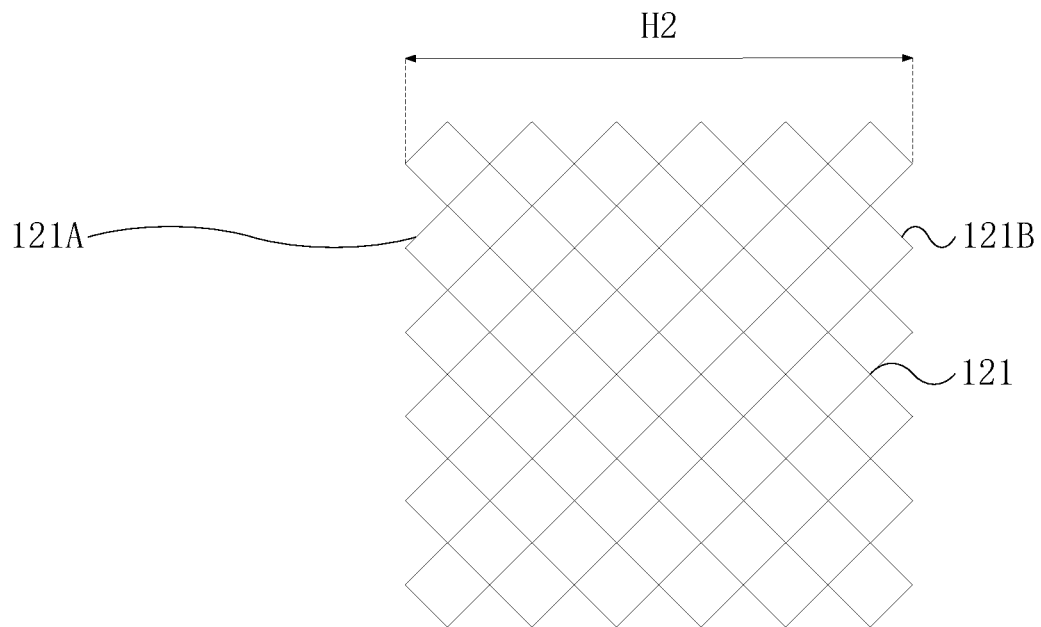
FIG. 5 is a schematic diagram of an elastic support net of a display device according to a representative embodiment of the present disclosure.

FIG. 5 is a schematic diagram of an elastic support net of a display device according to an embodiment of the present disclosure. As shown in FIG. 2 to FIG. 5, when the flexible display screen 11 is fully unfolded, a shortest distance between the first stop portion 131 and the first end 121A of the elastic support net 121 along the first direction D1 is H1; and when the elastic support net 121 is fully loosened, a shortest distance between the first end 121A and the second end 121B is H2, where H1<H2.

When the flexible display screen 11 is unfolded, the flexible display screen 11 is arranged along the first direction D1 in such a manner that the light non-exiting surface of the flexible display screen 11 is in close contact with the support layer 13, the elastic support net 121 is in contact with the support layer 13 at the second end 121B, the support layer 13 blocks the elastic support net 121 at the first stop portion 131, and a dimension of the elastic support net 121 from the first end 121A to the second end 121B is equal to H1 and less than H2. At this time, the elastic support net 121 is not fully loosened, and still has an elastic force along the first direction D1, and therefore the flexible display screen 11 can be supported by the support layer 13. The elastic support net 121 has a better support effect when it is not fully loosened than that when it is fully loosened.

Figure 6:
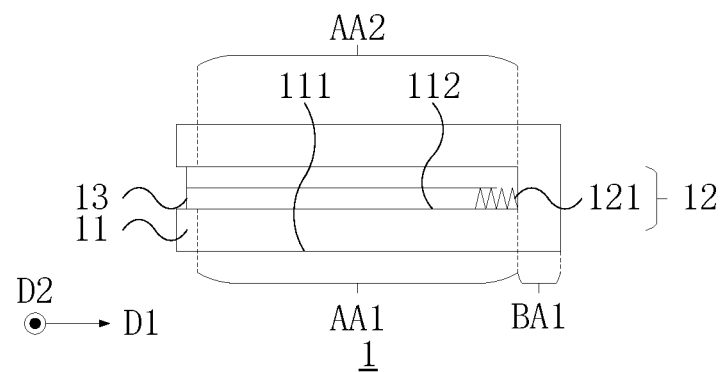
FIG. 6 is a top view of another display device in a folded state according to a representative embodiment of the present disclosure.
Figure 7:
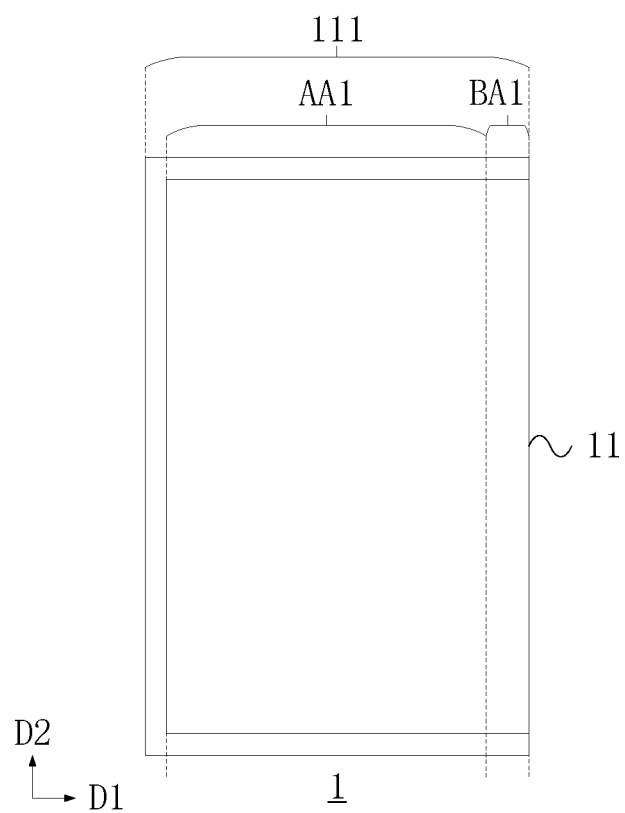
FIG. 7 is a front view of another display device in a folded state according to a representative embodiment of the present disclosure.
Figure 8:
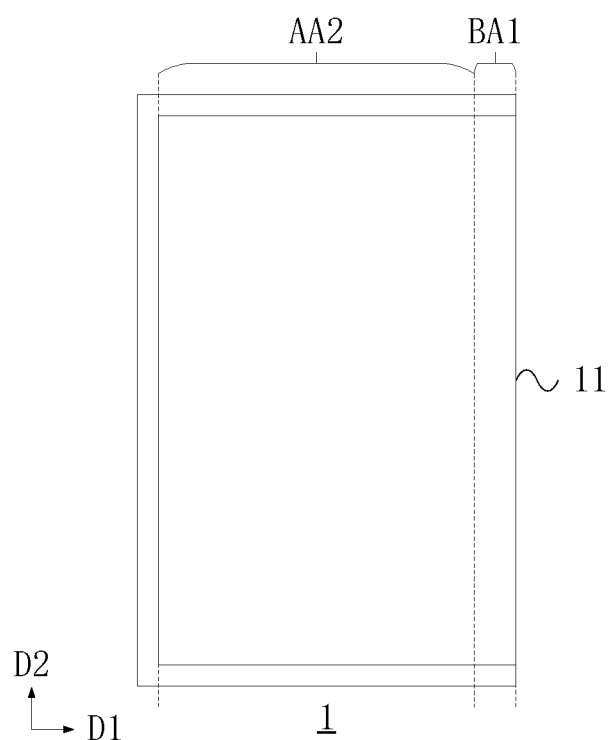
FIG. 8 is a rear view of another display device in a folded state according to a representative embodiment of the present disclosure.

FIG. 6 is a top view of another display device in a folded state according to an embodiment of the present disclosure. FIG. 7 is a front view of another display device in a folded state according to an embodiment of the present disclosure. FIG. 8 is a rear view of another display device in a folded state according to an embodiment of the present disclosure.

As shown in FIG. 2 to FIG. 8, when the flexible display screen 11 is in a fully unfolded state, the flexible display screen 11 includes the first display area AA1, the first bendable area BA1 and the second display area AA2 that are arranged in sequence along the first direction D1, and the elastic support net 121 is in a loosened state, completely covers the first bendable area BA1, and at least partially covers the second display area AA2. In a first folded state, the second display area AA2 rotates to the first display area AA1 and the side where the light non-exiting surface 112 is located, and the elastic support net 121 is tightened to be located between the first display area AA1 and the second display area AA2.

When unfolded, the flexible display screen 11 expands in both size and surface area. When the flexible display screen 11 is unfolded, the first bendable area BA1 is unfolded to be located between the first display area AA1 and the second display area AA2, and the elastic support net 121 is loosened as the flexible display screen 11 is unfolded. In this case, the elastic support net 121 completely covers the first bendable area BA1 and at least partially covers the second display area AA2. The elastic support net 121 supports the whole first bendable area BA1 and supports at least a part of the second display area AA2. Thus, the flexible display screen 11 is sufficiently flat and has an excellent display effect. In the first folded state, the size and surface area of the flexible display screen 11 are reduced in such a manner that the second display area AA2 rotates about the first bendable area BA1 to cover the first display area AA1, and the elastic support net 121 is tightened to be located between the first display area AA1 and the second display area AA2. Therefore, the flexible display screen 11 in the first folded state can be used as a mobile phone, which is convenient to carry and store.

Figure 9:
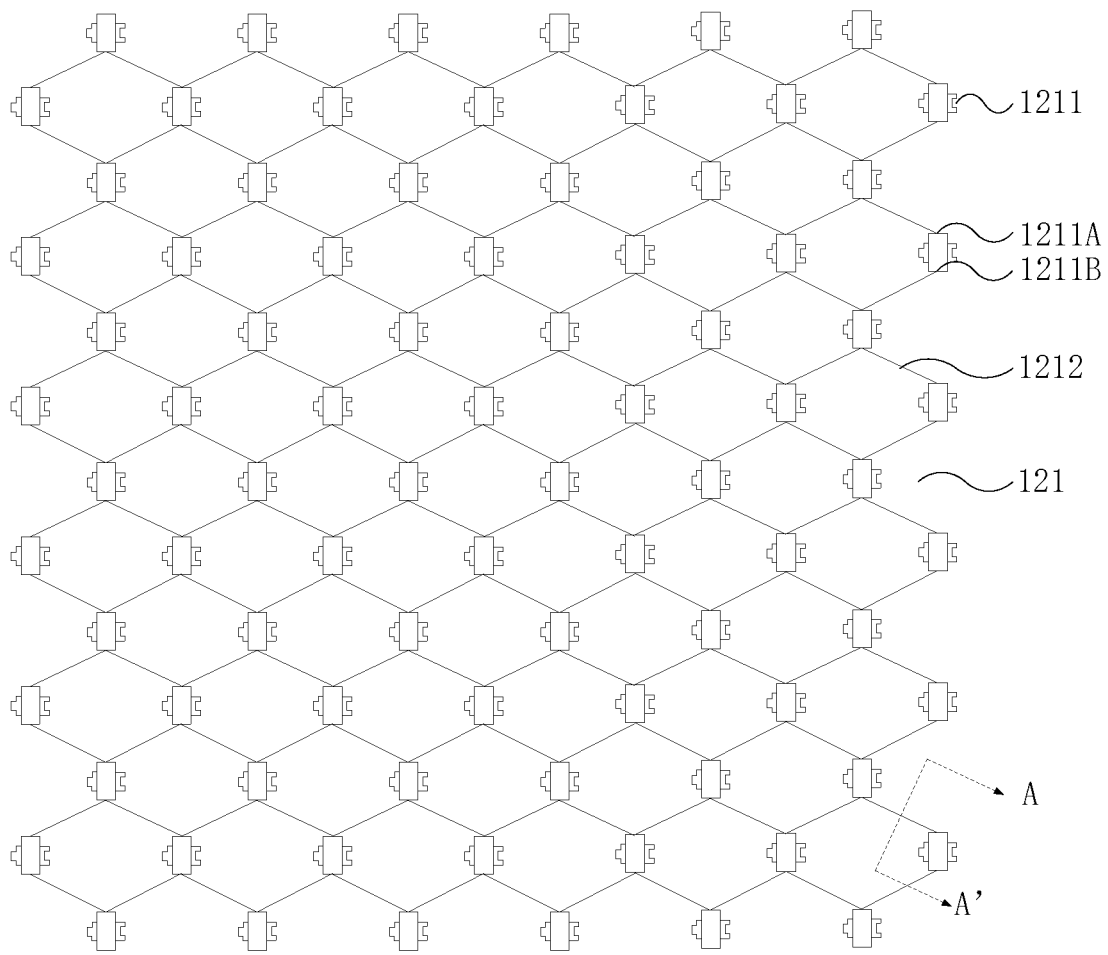
FIG. 9 is a schematic diagram of an elastic support net of another display device according to a representative embodiment of the present disclosure.
Figure 10:
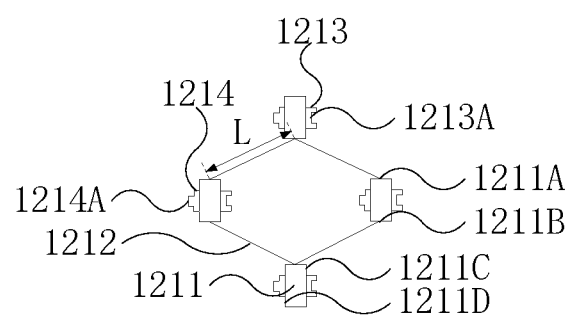
FIG. 10 is a schematic diagram of a grid of an elastic support net of another display device in a loosened state according to a representative embodiment of the present disclosure.
Figure 11:
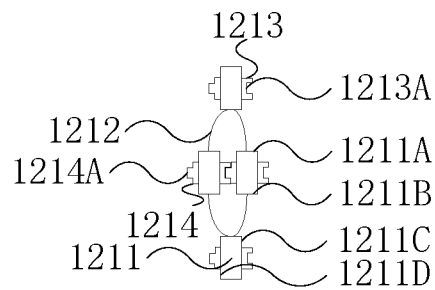
FIG. 11 is a schematic diagram of a grid of an elastic support net of another display device in a tightened state according to a representative embodiment of the present disclosure.

FIG. 9 is a schematic diagram of an elastic support net of another display device according to an embodiment of the present disclosure. FIG. 10 is a schematic diagram of a grid of an elastic support net of another display device in a loosened state according to an embodiment of the present disclosure. FIG. 11 is a schematic diagram of a grid of an elastic support net of another display device in a tightened state according to an embodiment of the present disclosure.

As shown in FIG. 9 to FIG. 11, the elastic support net 121 includes connection nodes 1211 and elastic wires 1212. The elastic wires 1212 have a shape memory property and can elongate automatically because of their "memory" property as the flexible display screen 11 is unfolded, thereby maintaining the flexible display screen 11 flat. The connection node 1211 includes a first end surface 1211A and a second end surface 1211B, each of which is connected to a respective elastic wire 1212. The first end surface 1211A and the second end surface 1211B of the connection node 1211 are disposed oppositely to each other. A plurality of elastic wires 1212 is connected with each other through the connection nodes 1211 to form the elastic support net 121.

In the elastic support net 121, the elastic wires 1212 elongate or shrink because of their shape memory function. The elastic wires 1212 and the connection nodes 1211 are connected to each other. The elastic wires 1212 are fixed on the opposite end surfaces of the connection nodes 1211. The connection nodes 1211 move as the elastic wires 1212 elongate or shrink. On the one hand, the elastic support net 121 is loosened as the elastic wires 1212 elongate. On the other hand, the elastic support net 121 is tightened as the elastic wires 1212 shrink. The elastic wire 1212 can be formed by a shape memory alloy having a shape memory effect, or other materials having a shape memory effect.

As shown in FIG. 9 to FIG. 11, each grid of the elastic support net 121 includes four connection nodes 1211 and four elastic wires 1212. A first connection node 1211 is connected to both a first elastic wire 1212 and a second elastic wire 1212. A second connection node 1211 is connected to both a third elastic wire 1212 and a fourth elastic wire 1212. A third connection node 1211 is connected to both the first elastic wire 1212 and the third elastic wire 1212. A fourth connection node 1211 is connected to both the second elastic wire 1212 and the fourth elastic wire 1212.

The four connection nodes 1211 of each grid of the elastic support net 121 are spread out as the four elastic wires 1212 elongate. The four connection nodes 1211 of each grid of the elastic support net 121 are gathered as the four elastic wires 1212 shrink. The first connection node 1211 moves as the first elastic wire 1212 and the second elastic wire 1212 elongate or shrink. The second connection node 1211 moves as the third elastic wire 1212 and the fourth elastic wire 1212 elongate or shrink. The third connection node 1211 moves as the first elastic wire 1212 and the third elastic wire 1212 elongate or shrink. The fourth connection node 1211 moves as the second elastic wire 1212 and the fourth elastic wire 1212 elongate or shrink. Thus, the elastic support net 121 is loosened or tightened through the four connection nodes 1211 and the four elastic wires 1212 of each grid.

As shown in FIG. 9 to FIG. 11, when the elastic support net 121 is fully loosened, a length of the elastic wire 1212 in each grid of the elastic support net 121 is L, and a shortest distance between the third connection node 1211 and the fourth connection node 1211 in each grid of the elastic support net 121 is $\sqrt{2}L$. Restated, a ratio of the shortest distance between the third connection node and the fourth connection node to the length of the elastic wire 1212 is $\sqrt{2}$. When the elastic support net 121 is fully tightened, a distance between the third connection node 1211 and the fourth connection node 1211 in each grid of the elastic support net 121 is equal to zero.

Each grid of the elastic support net 121 can be gradually loosened or tightened. The distance between the third connection node 1211 and the fourth connection node 1211 in each grid varies from 0 to $\sqrt{2}L$. Each grid is gradually loosened as the distance between the third connection node 1211 and the fourth connection node 1211 is gradually increased. Each grid is gradually tightened as the distance between the third connection node 1211 and the fourth connection node 1211 is gradually reduced. Thus, the elastic support net 121 can be gradually loosened or tightened as each grid changes.

As shown in FIG. 9 to FIG. 11, the elastic support net 121 further includes first magnetic buckles 1213 and second magnetic buckles 1214. The connection node 1211 further includes a third end surface 1211C connected to the first magnetic buckle 1213 and a fourth end surface 1211D connected to the second magnetic buckle 1214. The third end surface 1211C and the fourth end surface 1211D of the connection node 1211 are disposed oppositely to each other.

Two opposite connection nodes 1211 are fixed to the first magnetic buckle 1213 and the second magnetic buckle 1214, respectively. The first magnetic buckle 1213 and the second magnetic buckle 1214 can be coupled to each other, and meanwhile, the two opposite connection nodes 1211 are coupled to each other. As a result, the elastic wire 1212 therebetween is compressed, and the elastic support net 121 is tightened. The first magnetic buckle 1213 and the second magnetic buckle 1214 can be separated from each other, and meanwhile, the two opposite connection nodes 1211 are separated from each other. Thus, the elastic wire 1212 therebetween elongates, and the elastic support net 121 is loosened.

As shown in FIG. 9 to FIG. 11, the first magnetic buckle 1213 includes a notch 1213A and has a first polar magnetism, the second magnetic buckle 1214 includes a protrusion 1214A and has a second polar magnetism, the notch 1213A and the protrusion 1214A match with each other, and the first polar magnetism is opposite to the second polar magnetism.

The first magnetic buckle 1213 and the second magnetic buckle 1214 can be engaged with each other through the notch 1213A and the protrusion 1214A. At the same time, the first magnetic buckle 1213 and the second magnetic buckle 1214 can be magnetically snapped with each other through the first polar magnetism and the second polar magnetism. At this time, the connection node 1211 fixed to the first magnetic buckle 1213 and the connection node 1211 fixed to the second magnetic buckle 1214 are coupled to each other. As a result, the elastic wire 1212 therebetween is compressed, and the elastic support net 121 is tightened. Thereafter, the first magnetic buckle 1213 and the second magnetic buckle 1214 that have been engaged with each other or magnetically snapped with each other can be separated from each other. At this time, the connection node 1211 fixed to the first magnetic buckle 1213 and the connection node 1211 fixed to the second magnetic buckle 1214 are separated from each other. Thus, the elastic wire 1212 therebetween elongates and the elastic support net 121 is loosened.

As shown in FIG. 9 to FIG. 11, the first magnetic buckle 1213 connected to the third connection node 1211 and the second magnetic buckle 1214 connected to the fourth connection node 1211 in each grid of the elastic support net 121 are separated from each other when the elastic support net 121 is loosened, and for each grid of the elastic support net 121, the first magnetic buckle 1213 connected to the third connection node 1211 and the second magnetic buckle 1214 connected to the fourth connection node 1211 are coupled to each other when the elastic support net 121 is tightened.

Each grid of the elastic support net 121 includes the third and fourth connection nodes 1211. The third connection node 1211 of one grid is fixed to the first magnetic buckle 1213, and the fourth connection node 1211 of this grid is fixed to the second magnetic buckle 1214. The first magnetic buckle 1213 and the second magnetic buckle 1214 can be coupled to each other. At this time, the third connection node 1211 and the fourth connection node 1211 of the grid are coupled to each other. As a result, the elastic wire 1212 therebetween is compressed, and the grid and the elastic support net 121 are tightened. Thereafter, the first magnetic buckle 1213 and the second magnetic buckle 1214 can be separated from each other. At this time, the third connection node 1211 and the fourth connection node 1211 of the grid are separated from each other. Thus, the elastic wire 1212 therebetween elongates, and the elastic support net 121 is loosened.

In an embodiment, as shown in FIG. 2, the support layer 13 includes a first side wall 1331 and a second side wall 1332 that are disposed oppositely to each other in the first direction D1, and a first cavity 133 between the first side wall 1331 and the second side wall 1332, and the elastic support net 121 is located in the first cavity 133. The second side wall 1332 is located in the second display area AA2, and the first stop portion 131 is reused as the second side wall 1332.

In this embodiment, the elastic support net 121 is loosened or tightened in the first cavity 133. When the elastic support net 121 is loosened, the elastic support net 121 contacts the first stop portion 131, and the first cavity 133 extends from the first display area AA1 to the second display area AA2. In this case, the first side wall 1331 and the second side wall 1332 are disposed oppositely to each other, the first side wall 1331 is located in the first display area AA1, the second side wall 1332 is located in the second display area AA2, and the first stop portion 131 is located in the second display area AA2. The elastic support net 121, when loosened, covers the second display area AA2. In this case, the first stop portion 131 is reused as the second side wall 1332 to block the elastic support net 121. The elastic support net 121 realizes support at the support layer 13.

Figure 12:
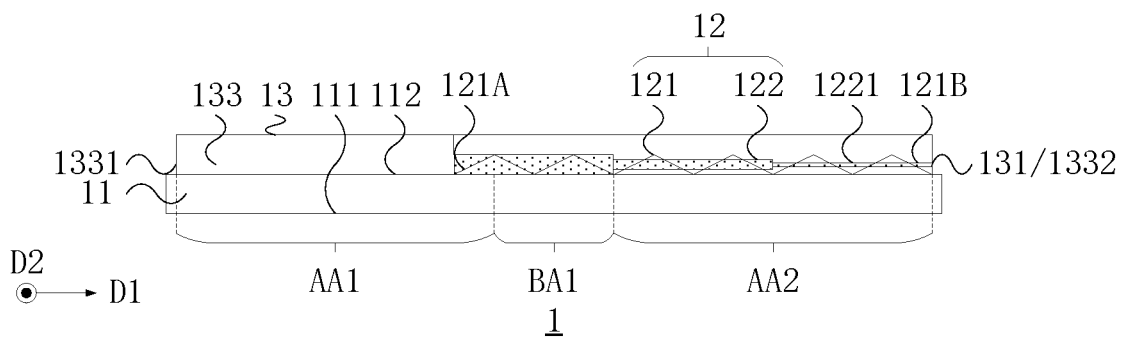
FIG. 12 is a top view of another display device in an unfolded state according to a representative embodiment of the present disclosure.
Figure 13:
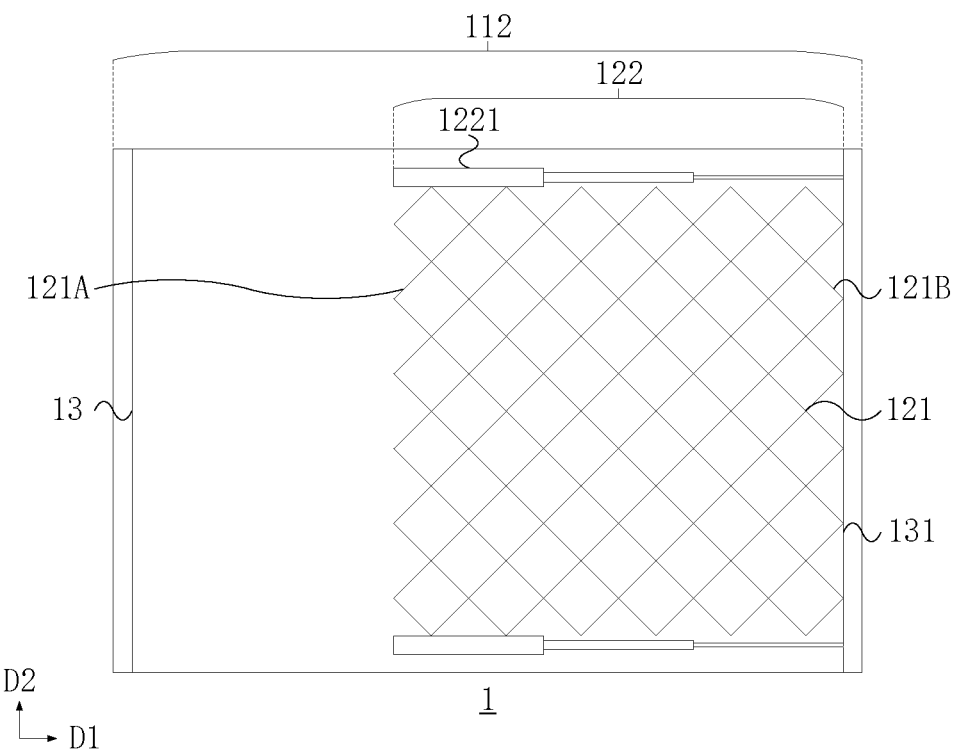
FIG. 13 is a rear view of another display device in an unfolded state according to an embodiment of the present disclosure.

FIG. 12 is a top view of another display device in an unfolded state according to an embodiment of the present disclosure. FIG. 13 is a rear view of another display device in an unfolded state according to an embodiment of the present disclosure.

As shown in FIG. 12 and FIG. 13, the support structure 12 further includes a telescopic support rod 122, one end of the telescopic support rod 122 is fixed at the light non-exiting surface 112 in the first display area AA1, and the telescopic support rod 122 is connected to the elastic support net 121. The telescopic support rod 122, when elongated, supports the second display area AA2.

The support structure 12 includes the elastic support net 121 and the telescopic support rod 122. The support structure 12 is disposed on the light non-exiting surface 112 of the flexible display screen 11. The telescopic support rod 122 is connected to the elastic support net 121. The elastic support net 121, the telescopic support rod 122 and the flexible display screen 11 can be unfolded together. The elastic support net 121 and the telescopic support rod 122, when unfolded, support the flexible display screen 11. In the unfolded state of the flexible display screen 11, one end of the telescopic support rod 122 is fixed in the first display area AA1, the telescopic support rod 122 extends to the second display area AA2 and supports the first display area AA1 and the second display area AA2, and the elastic support net 121 supports the first display area AA1 and the second display area AA2. In the unfolded state, the telescopic support rod 122 extends from the first display area AA1 to the second display area AA2, the first bendable area BA1 is located between the first display area AA1 and the second display area AA2, the telescopic support rod 122 supports the first bendable area BA1, and the elastic support net 121 supports the first bendable area BA1. When the flexible display screen 11 is fully flattened, the telescopic support rod 122 can enhance the rigidity of the support structure 12 and further ensure the support capability of the support structure 12. When the flexible display screen 11 is impacted by an external force, the elastic support net 121 can cooperate with the telescopic support rod 122, so that not only the impact stress can be buffered, but also a significant deformation of the flexible display screen 11 is avoided because of the rigidity of the telescopic support rod 122, thereby enhancing product reliability and user experience.

As shown in FIG. 12 and FIG. 13, the telescopic support rod 122 includes N telescopic support sub-rods 1221, where N is a positive integer and N>1. Rod diameters of first to $N^{th}$ telescopic support sub-rods 1221 gradually decrease, and an $X^{th}$ telescopic support sub-rod 1221 is sleeve-connected to an $(X+1)^{th}$ telescopic support sub-rod 1221, where X is a positive integer and $1 \leq X \leq N-1$.

The telescopic support rod 122 is retractable through the N telescopic support sub-rods 1221. The N telescopic support sub-rods 1221 includes the first to $N^{th}$ telescopic support sub-rods 1221. The first telescopic support sub-rod 1221 is sleeved on the second telescopic support sub-rod 1221. The second telescopic support sub-rod 1221 is sleeved on the third telescopic support sub-rod 1221. The $(N-1)^{th}$ telescopic support sub-rod 1221 is sleeved on the $N^{th}$ telescopic support sub-rod 1221. Other telescopic support sub-rods 1221 are arranged in a similar manner. A rod diameter of the first telescopic support sub-rod 1221 is larger than a rod diameter of the second telescopic support sub-rod 1221. The rod diameter of the second telescopic support sub-rod 1221 is larger than a rod diameter of the third telescopic support sub-rod 1221. A rod diameter of the $(N-1)^{th}$ telescopic support sub-rod 1221 is larger than a rod diameter of the $N^{th}$ telescopic support sub-rod 1221. Rod diameters of other telescopic support sub-rods 1221 are also set in a similar manner. The first telescopic support sub-rod 1221 is sleeve-connected to the second telescopic support sub-rod 1221. The second telescopic support sub-rod 1221 is sleeve-connected to the third telescopic support sub-rod 1221. The (N−1)$^{th}$ telescopic support sub-rod 1221 is sleeve-connected to the N$^{th}$ telescopic support sub-rod 1221. The other telescopic support sub-rods 1221 are also sleeve-connected in a similar manner. The telescopic support rod 122 elongates as the N telescopic support sub-rods 1221 are spread out. The telescopic support rod 122 is retracted as the N telescopic support sub-rods 1221 are converged.

Figure 14:
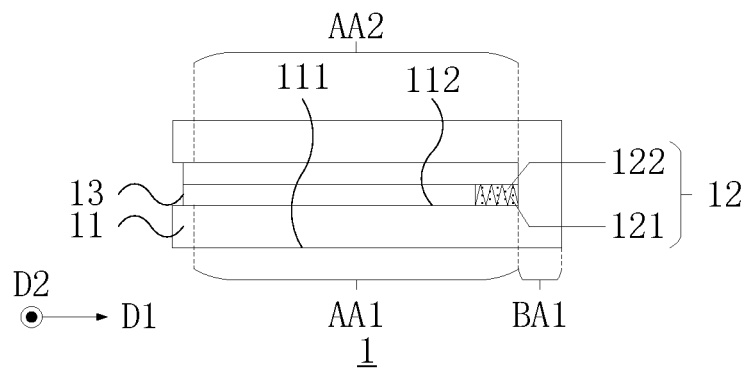
FIG. 14 is a top view of another display device in a folded state according to a representative embodiment of the present disclosure.

FIG. 14 is a top view of another display device in a folded state according to an embodiment of the present disclosure.

As shown in FIG. 12 to FIG. 14, in a first unfolded state, the second display area AA2 is located at a side of the first bendable area BA1 facing away from the first display area AA1, and the telescopic support rod 122 extends to the second display area AA2; and in a first folded state, the second display area AA2 rotates to the first display area AA1 and the side where the light non-exiting surface 112 is located, and the telescopic support rod 122 is retracted to the first display area AA1.

In the first unfolded state, the flexible display screen 11 expands in size and surface area, the second display area AA2 is located at the side of the first bendable area BA1 facing away from the first display area AA1, and the telescopic support rod 122 extends to the first bendable area BA1 and the second display area AA2. In this state, the telescopic support rod 122 supports the first bendable area BA1 and the second display area AA2, and thus, the flexible display screen 11 is sufficiently flat and has excellent display effect. In the first folded state, the size and surface area of the flexible display screen 11 decrease, the second display area AA2 rotates about the first bendable area BA1 to cover the first display area AA1, the telescopic support rod 122 is retracted to be located between the first display area AA1 and the second display area AA2. Therefore, the flexible display screen 11 in the first folded state is convenient to carry and store.

Figure 15:
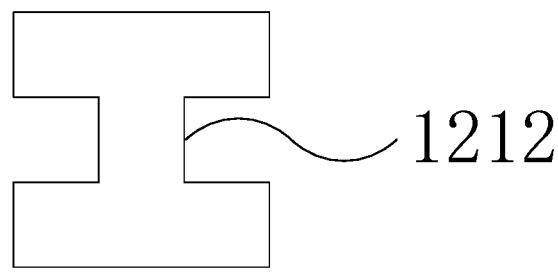
FIG. 15 is a schematic diagram of the elastic support net of the display device shown in FIG. 9 at AA'.

FIG. 15 is a schematic diagram of the elastic support net of the display device shown in FIG. 9 at AA'. As shown in FIG. 2, FIG. 9 and FIG. 15, a cross section of the elastic wire 1212 that is perpendicular to the light non-exiting surface 112 and a direction along which the elastic wire 1212 extends is I-shaped.

The elastic support net 121 is loosened as the elastic wire 1212 elongates. The elastic support net 121 is tightened as the elastic wire 1212 shrinks. The elastic support net 121 is in close contact with the light non-exiting surface 112 of the flexible display screen 11. The cross section of the elastic wire 1212 that is perpendicular to the light non-exiting surface 112 and the direction along which the elastic wire 1212 extends is I-shaped. The elastic wire 1212 extends along a direction parallel with the light non-exiting surface 112. Since the elastic wire 1212 is I-shaped, the elastic wire 1212 can also generate a support force in a direction perpendicular to the light non-exiting surface 112, which further strengthens the support capability of the support structure 12 in a thickness direction of the flexible display screen 11 and improves a support reliability of the elastic support net 121 to the flexible display screen 11 when the elastic support net 121 is loosened. In addition, by using such elastic wire 1212, the elastic support net 121 has a simplified design and a reduced weight.

Figure 16:
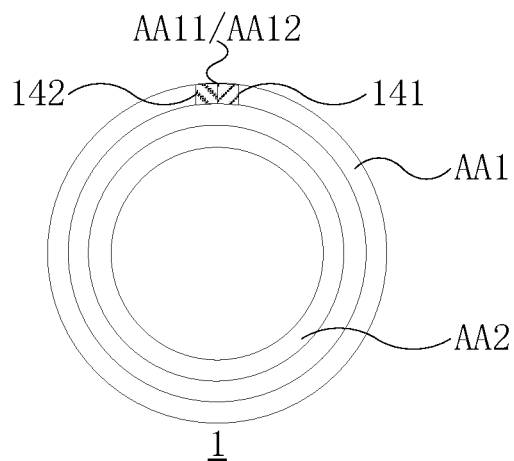
FIG. 16 is a side view of another display device in a folded state according to a representative embodiment of the present disclosure.

FIG. 16 is a side view of another display device in a folded state according to an embodiment of the present disclosure. As shown in FIG. 3 and FIG. 16, the first display area AA1 includes a first side edge AA11 and a second side edge AA12 along a second direction D2, where the first direction D1 and the second direction D2 intersect with each other. In a second folded state, the first display area AA1 and the second display area AA2 are bent about the first direction D1, the first side edge AA11 and the second side edge AA12 of the first display area AA1 are in contact with each other, and the first side edge AA11 and the second side edge AA12 of the first display area AA1 are arranged opposite to each other.

In the first unfolded state, the flexible display screen 11 is fully unfolded so that the second display area AA2 is located at the side of the first bendable area BA1 facing away from the first display area AA1. In the first unfolded state, the first display area AA1, the first bendable area BA1 and the second display area AA2 can display an image corporately. Thus, the flexible display screen 11 realizes a tablet computer mode in the first unfolded state. In the first folded state, the flexible display screen 11 is partially folded so that the second display area AA2 rotates about the first bendable area BA1 and covers the first display area AA1. In the first folded state, the first display area AA1 can be fully unfolded to display images. Thus, the flexible display screen 11 realizes a mobile phone mode in the first folded state. In the second folded state, the flexible display screen 11 is further folded so that the first display area AA1 and the second display area AA2 are bent about the first direction D1. The two opposite side edges of the first display area AA1 in the second direction D2 are in contact with each other. The first display area AA1 may be constructed as a ring to display images. In this case, the flexible display screen 11 realizes a bracelet mode in the second folded state.

As shown in FIG. 3 and FIG. 16, the display device 1 further includes a first magnet 141 having a first polar magnetism and a second magnet 142 having a second polar magnetism, and the first polar magnetism is opposite to the second polar magnetism so that the first magnet 141 and the second magnet 142 are attractable to each other. The first magnet 141 is fixed to the first side edge AA11 of the first display area AA1, and the second magnet 142 is fixed to the second side edge AA12 of the first display area AA1. A distance between the first magnet 141 and the elastic support net 121 in the second direction D2 is greater than a first distance, and a distance between the second magnet 142 and the elastic support net 121 in the second direction D2 is greater than a second distance. The first distance and the second distance are set in such a manner that the elastic support net 121 is not magnetically interfered by the magnets 141, 142.

The first magnet 141 is fixed to the first side edge AA11 of the first display area AA1, the second magnet 142 is fixed to the second side edge AA12 of the first display area AA1, and the first magnet 141 and the second magnet 142 can be magnetically snapped with each other so that the first side edge AA11 and the second side edge AA12 of the first display area AA1 are bonded to each other. Therefore, the flexible display screen 11 may realize the bracelet mode in the second folded state. Thereafter, the first magnet 141 and the second magnet 142 can be separated from each other, the first side edge AA11 and the second side edge AA12 of the first display area AA1 are separated from each other, and the flexible display screen 11 changes to the mobile phone mode or the tablet computer mode. In addition, the elastic support net 121 further includes the first magnetic buckles 1213 and the second magnetic buckles 1214. The first magnet 141 and the elastic support net 121 are separated by a certain distance. The first magnet 141 does not affect the first magnetic buckles 1213 and the second magnetic buckles 1214. The second magnet 142 and the elastic support net 121 are separated by a certain distance. The second magnet 142 does not affect the first magnetic buckles 1213 and the second magnetic buckles 1214.

Figure 17:
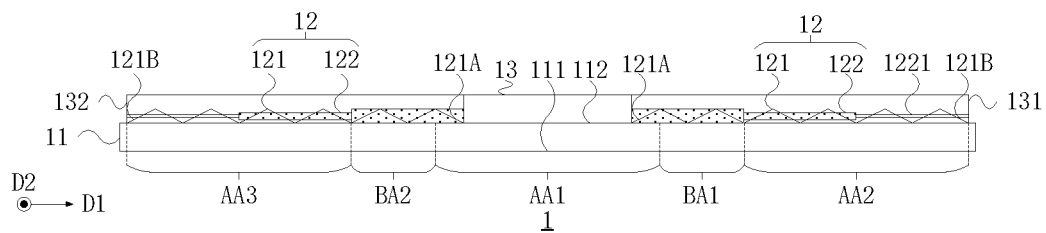
FIG. 17 is a top view of another display device in an unfolded state according to a representative embodiment of the present disclosure.
Figure 18:
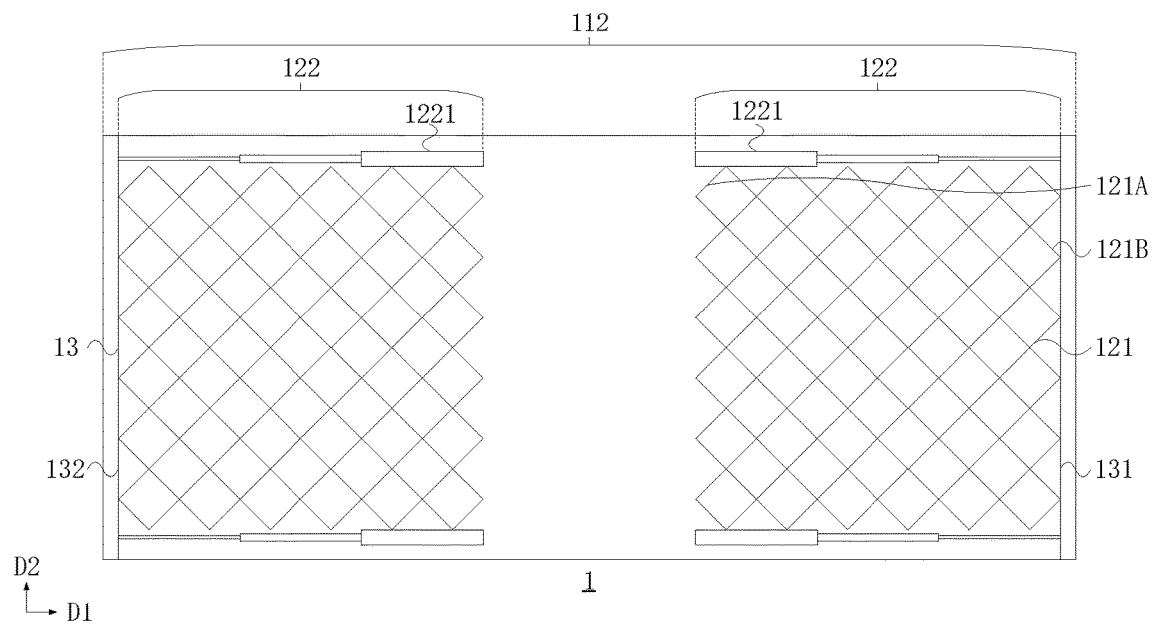
FIG. 18 is a rear view of another display device in an unfolded state according to a representative embodiment of the present disclosure.

FIG. 17 is a top view of another display device in an unfolded state according to an embodiment of the present disclosure. FIG. 18 is a rear view of another display device in an unfolded state according to an embodiment of the present disclosure.

As shown in FIG. 17 and FIG. 18, the flexible display screen 11 further includes a third display area AA3 and a second bending area BA2. When the display device 1 is fully unfolded, the third display areas AA3, the second bending area BA2, and the first display area AA1 are arranged sequentially in the first direction D1. The second bending area BA2 connects the third display area AA3 with the first display area AA1. The support layer 13 further includes a second stop portion 132 located in the third display area AA3. A first end 121A of another elastic support net 121 is fixed to the support layer 13 in the first display area AA1. When the flexible display screen 11 is fully unfolded, the elastic support net 121 is loosened, and a second end 121B of the elastic support net 121 is in contact with the second stop portion 132 to support the second bending area BA2. The second stop portion 132 is made of a hard material, such as PET, acrylic, or other materials that have a relatively large modulus of elasticity, in order to overcome the force applied by the elastic support net 121 in a loosened state and plays a role in stopping the elastic support net 121.

The flexible display screen 11 can be unfolded and emit light from the light-exiting surface 111. In the unfolded state, the second bending area BA2 is unfolded and located between the first display area AA1 and the third display area AA3, and the first display area AA1, the second bending area BA2, and the third display area AA3 display images corporately. In this case, the support structure 12 is elongated by the elastic support net 121 to support the flexible display screen 11, in which the first end 121A of the another elastic support net 121 is located in the first display area AA1, and the second end 121B of the another elastic support net 121 is located in the third display area AA3, so that the elastic support net 121 supports the first display area AA1 and the third display area AA3 while supporting the second bending area BA2. In addition, the light non-exiting surface 112 of the flexible display screen 11 is in close contact with the support layer 13, this elastic support net 121 is fixedly connected to the support layer 13 at the first end 121A and is in contact with the support layer 13 at the second end 121B. Therefore, the support layer 13 blocks the elastic support net 121 at the second stop portion 132, the support structure 12 supports the flexible display screen 11, and thus, the flexible display screen 11 is sufficiently flat and has excellent display effect. Moreover, because the space where the elastic support net 121 is located in is not a vacuum space, when the flexible display screen 11 is impacted, the impact resistance of the flexible display screen 11 can be increased under the buffering effect of the elastic support net 121 and air, thereby improving the reliability of the display device.

As shown in FIG. 17 and FIG. 18, the display device 1 includes at least two telescopic support rods 122. One end of each of the at least two telescopic support rods 122 is fixed to the light non-exiting surface 112 of the first display area AA1. The telescopic support rod 122 is connected to the elastic support net 121. At least one of the at least two telescopic support rods 122, when elongated, supports the second display area AA2 and the first bendable area BA1. At least another one of the at least two telescopic support rods 122, when elongated, supports the third display area AA3 and the second bending area BA2.

In an embodiment, two telescopic support rods 122 are arranged on the light non-exiting surface 112 of the flexible display screen 11. A first telescopic support rod 122 is connected to a first elastic support net 121, and a second telescopic support rod 122 is connected to a second elastic support net 121. The elastic support nets 121 and the telescopic support rods 122 elongate as the flexible display screen 11 is unfolded. The elastic support nets 121 and the telescopic support rods 122, when elongated, support the flexible display screen 11. When the flexible display screen 11 is unfolded, one end of the first telescopic support rod 122 is fixed in the first display area AA1 and another end of the first telescopic support rod 122 extends to the second display area AA2. That is, the first telescopic support rod 122 extends from the first display area AA1 to the second display area AA2, and thus supports the first display area AA1 and the second display area AA2. The first bendable area BA1 is located between the first display area AA1 and the second display area AA2, and the telescopic support rod 122 also supports the first bendable area BA1. At the same time, the first elastic support net 121 supports the first display area AA1 and the second display area AA2 and also supports the first bendable area BA1. Also, when the flexible display screen 11 is unfolded, one end of the second telescopic support rod 122 is fixed in the first display area AA1 and another end of the second telescopic support rod 122 extends to the third display area AA3. That is, the second telescopic support rod 122 extends from the first display area AA1 to the third display area AA3, and thus supports the first display area AA1 and the third display area AA3. The second bending area BA2 is located between the first display area AA1 and the third display area AA3, and the second telescopic support rod 122 also supports the second bending area BA2. At the same time, the second elastic support net 121 supports the first display area AA1 and the third display area AA3, and also supports the second bending area BA2. The combining support effect of the elastic support nets 121 and the telescopic support rods 122 is better than the support effect of the elastic support nets 121 alone. Therefore, when unfolded, the flexible display screen 11 is flatter and has a better display effect.

Figure 19:
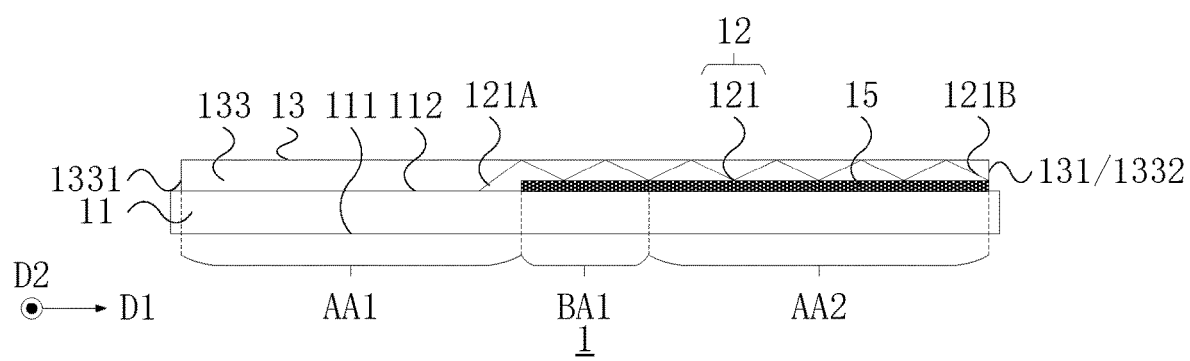
FIG. 19 is a top view of another display device in an unfolded state according to a representative embodiment of the present disclosure.

FIG. 19 is a top view of another display device in an unfolded state according to an embodiment of the present disclosure. As shown in FIG. 19, the display device 1 further includes a pressure sensitive adhesive 15. When the flexible display screen 11 is fully unfolded, the pressure sensitive adhesive 15 is disposed between the support structure 12 and the light non-exiting surface 112 of the flexible display screen 11. The support structure 12 and the light non-exiting surface 112 of the flexible display screen 11 is fixed to each other through the pressure sensitive adhesive 15.

The support structure 12 is located on the light non-exiting surface 112 of the flexible display screen 11. The flexible display screen 11 is unfolded as the support structure 12 elongates. When the flexible display screen 11 is unfolded, the support structure 12 and the light non-exiting surface 112 are fixed to each other through the pressure sensitive adhesive 15. The pressure sensitive adhesive 15 prevents the support structure 12 from detaching from the flexible display screen 11 when the support structure 12 shrinks, and can also functions to fix the support structure 12 to enhance the support reliability thereof. Thus, the support structure 12, when elongated, well supports the flexible display screen 11.

As shown in FIG. 6, when the flexible display screen 11 changes from a fully unfolded state to a fully folded state, the elastic support net 121 is separated from the first bendable area BA1, and the elastic support net 121 changes from a loosened state to a tightened state.

In the fully unfolded state, the elastic support net 121 is fixed to the flexible display screen 11 through the pressure sensitive adhesive 15. In this state, the elastic support net 121 is loosened to support the first bendable area BA1. When fully folded, the flexible display screen 11 is detached from the elastic support net 121. At this time, the elastic support net 121 is tightened to be located between the first display area AA1 and the second display area AA2.

In summary, the display device provided by the present disclosure includes the flexible display screen and the support structure. The support structure includes the elastic support net. When the display device is fully unfolded, it includes the first display area, the first bendable area, and the second display area that are sequentially arranged along the first direction. The first folding area connects the first display area with the second display area. The display device further includes the support layer, and the support layer includes the first stop portion located in the second display area. The flexible display screen includes the light exiting surface and the light non-exiting surface that are disposed opposite to each other, and the support layer is located on the side of the flexible display screen where the light non-exiting surface is located. The elastic support net includes the first end and the second end that are disposed opposite to each other along the first direction. The first end of the elastic support net is fixed to the support layer in the first display area. When the flexible display screen is fully unfolded, the elastic support net is loosened, and the second end of the elastic support net is in contact with the first stop portion to support the first bendable area. Therefore, the flexible display screen is sufficiently flat and has excellent display effect.

The above-described embodiments are representative embodiments of the present disclosure and are not intended to limit the present disclosure. Any modifications, equivalent substitutions and improvements made within the principle of the present disclosure shall fall into the protection scope of the present disclosure.

What is claimed is:

1. A display device having a first display area, a first bendable area, and a second display area that are arranged sequentially along a first direction when the display device is fully unfolded, the first bendable area connecting the first display area with the second display area, wherein the display device comprises:
a flexible display screen comprising a light exiting surface and a light non-exiting surface that are disposed oppositely to each other;
a support structure comprising an elastic support net, wherein the elastic support net comprises a first end and a second end that are disposed oppositely to each other along the first direction; and
a support layer located on a side of the flexible display screen where the light non-exiting surface is located, wherein the support layer comprises a first stop portion located in the second display area,
wherein the first end of the elastic support net is fixed to the support layer in the first display area, and when the display device is fully unfolded, the flexible display screen is fully unfolded, and the elastic support net is loosened and the second end of the elastic support net is in contact with the first stop portion to support the first bendable area; and
wherein when the flexible display screen is fully unfolded, a shortest distance between the first stop portion and the first end of the elastic support net along the first direction is H1, and when the elastic support net is fully loosened, a shortest distance between the first end and the second end is H2, where H1<H2.

2. The display device according to claim 1, wherein when the flexible display screen is fully unfolded, the flexible display screen has the first display area, the first bendable area and the second display area that are arranged sequentially along the first direction, and the elastic support net is loosened to completely cover the first bendable area and at least partially cover the second display area; and
wherein the display device can be folded into a first folded state in which the second display area rotates to the first display area and a side where the non-light exiting surface is located, and the elastic support net is tightened to be located between the first display area and the second display area.

3. The display device according to claim 2, wherein the first display area comprises a first side edge and a second side edge that are disposed oppositely to each other in a second direction, the second direction intersecting with the first direction; and
wherein the display device further has a second folded state in which the first display area and the second display area are bent about the first direction in such a manner that the first side edge and the second side edge of the first display area are in contact with each other.

4. The display device according to claim 3, further comprising:
a first magnet having a first polar magnetism and fixed to the first side edge of the first display area, a distance between the first magnet and the elastic support net being greater than a first distance; and
a second magnet having a second polar magnetism and fixed to the second side edge of the first display area, a distance between the second magnet and the elastic support net being greater than a second distance,
wherein the first polar magnetism is opposite to the second polar magnetism so that the first magnet and the second magnet are attractable to each other, and the first distance and the second distance are set such that the elastic support net is not magnetically interfered by the first magnet and the second magnet.

5. The display device according to claim 1, wherein the support layer comprises a first side wall and a second side wall that are disposed oppositely to each other along the first direction, and a first cavity between the first side wall and the second side wall, the elastic support net is located in the first cavity, the second side wall is located in the second display area, and the first stop portion is reused as the second side wall.

6. The display device according to claim 1, wherein the display device further comprises a third display area and a second bending area, and when the display device is fully unfolded, the third display area, the second bending area, and the first display area are sequentially arranged along the first direction,
wherein the second bending area connects the third display area with the first display area,
wherein the support layer further comprises a second stop portion located in the third display area, and wherein the display device further comprises an additional elastic support net, wherein a first end of the additional elastic support net is fixed to the support layer in the first display area, and when the flexible display screen is fully unfolded, the additional elastic support net is loosened and a second end of the additional elastic support net is in contact with the second stop portion to support the second bending area.

7. The display device according to claim 6, further comprising:
at least two telescopic support rods, wherein one end of each of the at least two telescopic support rods is fixed to the light non-exiting surface in the first display area, the at least two telescopic support rods are connected to the elastic support nets, at least one telescopic support rod of the at least two telescopic support rods, when elongated, supports the second display area and the first bendable area, and at least one telescopic support rod of the at least two telescopic support rods, when elongated, supports the third display area and the second bending area.

8. The display device according to claim 1, further comprising:
a pressure sensitive adhesive,
wherein when the flexible display screen is fully unfolded, the pressure sensitive adhesive is disposed between the support structure and the light non-exiting surface of the flexible display screen, and the support structure and the light non-exiting surface of the flexible display screen are fixed to each other by the pressure sensitive adhesive.

9. The display device according to claim 1, wherein when the flexible display screen changes from a fully unfolded state to a fully folded state, the elastic support net is separated from the first bendable area and the elastic support net changes from a loosened state to a tightened state.

10. A display device having a first display area, a first bendable area, and a second display area that are arranged sequentially along a first direction when the display device is fully unfolded, the first bendable area connecting the first display area with the second display area, wherein the display device comprises:
a flexible display screen comprising a light exiting surface and a light non-exiting surface that are disposed oppositely to each other;
a support structure comprising an elastic support net, wherein the elastic support net comprises a first end and a second end that are disposed oppositely to each other along the first direction; and
a support layer located on a side of the flexible display screen where the light non-exiting surface is located, wherein the support layer comprises a first stop portion located in the second display area,
wherein the first end of the elastic support net is fixed to the support layer in the first display area, and when the display device is fully unfolded, the flexible display screen is fully unfolded, and the elastic support net is loosened and the second end of the elastic support net is in contact with the first stop portion to support the first bendable area; and
wherein the elastic support net comprises:
a plurality of elastic wires, wherein each elastic wire of the plurality of elastic wires has a shape memory property; and
a plurality of connection nodes, wherein each connection node of the plurality of connection nodes comprises a first end surface and a second end surface that are disposed oppositely to each other and are connected to at least two of the plurality of elastic wires, respectively,
wherein elastic wires of the plurality of elastic wires are connected through the plurality of connection nodes to form the elastic support net.

11. The display device according to claim 10, wherein the elastic support net forms a plurality of grids, each grid of the plurality of grids comprising four connection nodes of the plurality of connection nodes and four elastic wires of the plurality of elastic wires, wherein a first connection node of the four connection nodes is connected to a first elastic wire and a second elastic wire of the four elastic wires, a second connection node of the four connection nodes is connected to a third elastic wire and a fourth elastic wire of the four elastic wires, a third connection node of the four connection nodes is connected to the first elastic wire and the third elastic wire, and a fourth connection node of the four connection nodes is connected to the second elastic wire and the fourth elastic wire.

12. The display device according to claim 11, wherein when the elastic support net is fully loosened, a ratio of a shortest distance between the third connection node and the fourth connection node to a length of each of the four elastic wires is equal to $\sqrt{2}$; and
when the elastic support net is fully tightened, a distance between the third connection node and the fourth connection node is equal to zero.

13. The display device according to claim 11, wherein the elastic support net further comprises first magnetic buckles and second magnetic buckles, wherein each of the plurality of connection nodes further comprises a third end surface and a fourth end surface that are disposed oppositely to each other and are connected to one of the first magnetic buckles and one of the second magnetic buckles, respectively.

14. The display device according to claim 13, wherein each of the first magnetic buckles comprises a notch and has a first polar magnetism, each of the second magnetic buckles comprises a protrusion and has a second polar magnetism, the notch and the protrusion match with each other, and the first polar magnetism is opposite to the second polar magnetism.

15. The display device according to claim 13, wherein when the elastic support net is loosened, for each grid of the elastic support net, the first magnetic buckle connected to the third connection node is separated from the second magnetic buckle connected to the fourth connection node; and
when the elastic support net is tightened, for each grid of the elastic support net, the first magnetic buckle connected to the third connection node is coupled to the second magnetic buckle connected to the fourth connection node.

16. The display device according to claim 10, wherein a cross section of each of the plurality of the elastic wires that is perpendicular to the light non-exiting surface and a direction along which the elastic wire extends is I-shaped.

17. A display device having a first display area, a first bendable area, and a second display area that are arranged sequentially along a first direction when the display device is fully unfolded, the first bendable area connecting the first display area with the second display area, wherein the display device comprises:
a flexible display screen comprising a light exiting surface and a light non-exiting surface that are disposed oppositely to each other;
a support structure comprising an elastic support net, wherein the elastic support net comprises a first end and a second end that are disposed oppositely to each other along the first direction; and a support layer located on a side of the flexible display screen where the light non-exiting surface is located, wherein the support layer comprises a first stop portion located in the second display area, wherein the first end of the elastic support net is fixed to the support layer in the first display area, and when the display device is fully unfolded, the flexible display screen is fully unfolded, and the elastic support net is loosened and the second end of the elastic support net is in contact with the first stop portion to support the first bendable area; and wherein the support structure further comprises a telescopic support rod, wherein one end of the telescopic support rod is fixed to the light non-exiting surface in the first display area, the telescopic support rod is connected to the elastic support net, and the telescopic support rod, when elongated, supports the second display area.

18. The display device according to claim 17, wherein the telescopic support rod comprises N telescopic support sub-rods, where N is a positive integer greater than 1;

wherein rod diameters of a first telescopic support sub-rod to an $N^{th}$ telescopic support sub-rod of the N telescopic support sub-rods gradually decrease, and an $X^{th}$ telescopic support sub-rod of the N telescopic support sub-rods is sleeve-connected to a $(X+1)^{th}$ telescopic support sub-rod of the N telescopic support sub-rods, where X is a positive integer and $1 \le X \le N-1$.

19. The display device according to claim 17, wherein the display device has a first unfolded state and a first folded state, wherein in the first unfolded state, the second display area is located at a side of the first bendable area facing away from the first display area, and the telescopic support rod extends to the second display area; and wherein in the first folded state, the second display area rotates to the first display area and a side where the light non-exiting surface is located, and the telescopic support rod is retracted to the first display area.

* * * * *